(12) United States Patent
Fong

(10) Patent No.: US 7,816,983 B2
(45) Date of Patent: Oct. 19, 2010

(54) FAST SWITCH FOR CONTROLLING A DIFFERENTIAL-PAIR AMPLIFIER

(75) Inventor: Keng Leong Fong, Sunnyvale, CA (US)

(73) Assignee: Ralink Technology Corporation, Jhubei (TW)

( * ) Notice: Subject to any disclaimer, the term of this patent is extended or adjusted under 35 U.S.C. 154(b) by 34 days.

(21) Appl. No.: 12/013,312

(22) Filed: Jan. 11, 2008

(65) Prior Publication Data

US 2009/0179701 A1    Jul. 16, 2009

(51) Int. Cl.
  *H03F 1/14* (2006.01)
(52) U.S. Cl. .......................................... 330/51; 330/261
(58) Field of Classification Search .................. 330/51, 330/252, 254, 261
  See application file for complete search history.

(56) References Cited

U.S. PATENT DOCUMENTS 3,431,505 A * 3/1969 Agostino .................... 330/252
3,508,161 A * 4/1970 Bingham .................... 329/337
5,818,300 A * 10/1998 Hirano ....................... 330/252
6,577,195 B2 * 6/2003 Newtown ................... 330/252

* cited by examiner

*Primary Examiner*—Henry K Choe
(74) *Attorney, Agent, or Firm*—Sawyer Law Group, P.C.

(57) ABSTRACT

A differential-pair amplifier comprising a transistor pair. The differential-pair amplifier includes a current source coupled to the transistor pair for providing a bias current to the transistor pair. The differential-pair amplifier also includes a switching mechanism coupled to the transistor pair for steering the bias current away from the transistor pair when disabling the amplifier operation. A system and method in accordance with the present invention allows fast enabling and disabling of a differential-pair amplifier. This fast switching technique can be used in the signal paths where the switching time is critical.

8 Claims, 1 Drawing Sheet

FAST SWITCH FOR CONTROLLING A DIFFERENTIAL-PAIR AMPLIFIER

FIELD OF THE INVENTION

The present invention relates generally to an integrated circuit and more specifically to enabling and disabling a differential-pair amplifier in such a circuit.

BACKGROUND OF THE INVENTION

Differential-pair amplifier is utilized in a variety of applications. Conventionally, the differential-pair amplifier is enabled and disabled by turning on and off a tail current source. The tail current source is utilized to provide bias current to the differential-pair amplifier. Typically, the differential-pair amplifier is enabled and disabled by turning on and turning off the tail current source. This particular scheme is too slow because it requires charging and discharging transistors in the tail current source.

Accordingly, the conventional process for enabling and disabling the amplifier can be too slow for certain applications particularly if the tail current is implemented using bipolar devices.

Accordingly, what is desired is a method which allows faster switching to turn on and off a differential-pair amplifier. The present invention addresses such a need.

SUMMARY OF THE INVENTION

A differential-pair amplifier comprising a transistor pair. The differential-pair amplifier includes a source coupled to the transistor pair for providing a current to the transistor pair. The differential-pair amplifier also includes a switching mechanism coupled to the transistor pair for steering the current away from the transistor pair when disabling the amplifier operation.

A system and method in accordance with the present invention allows fast enabling and disabling of a differential-pair amplifier. This fast switching technique can be used in the signal paths where the switching time is critical.

DETAILED DESCRIPTION OF PREFERRED EMBODIMENTS

The present invention relates generally to an integrated circuit and more specifically to enabling and disabling a differential-pair amplifier in such a circuit. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
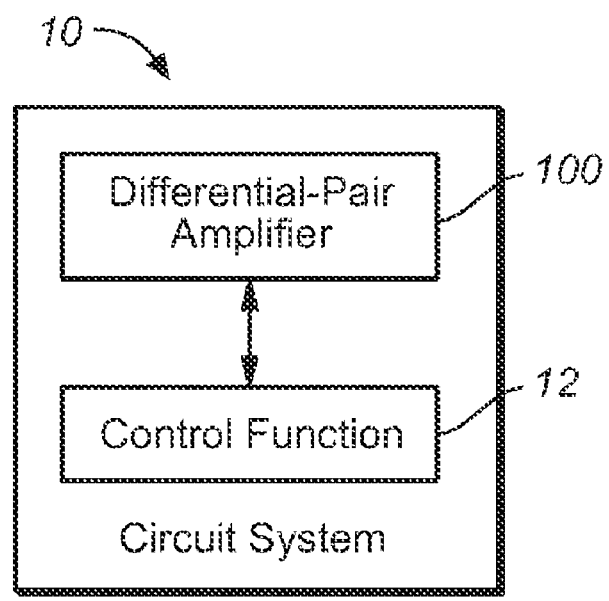
FIG. 1 shows an integrated circuit which utilizes a differential-pair amplifier.
Figure 2:
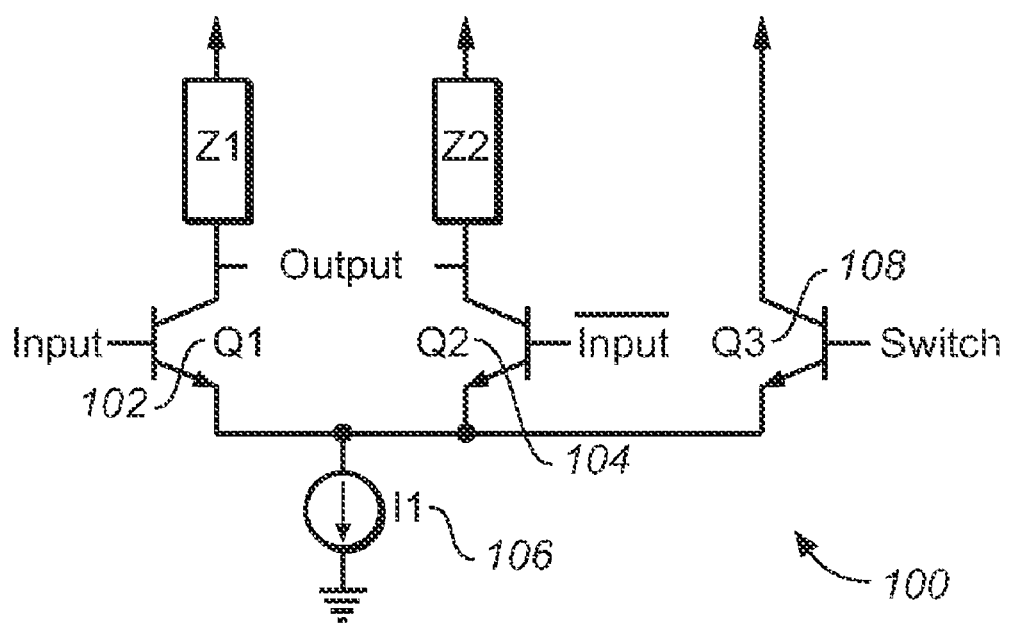
FIG. 2 shows a differential-pair amplifier according to the present invention.

FIG. 1 is circuit system 10 which utilizes a differential-pair amplifier circuit 100 coupled to a control function 12 within the circuit system to provide a high speed switching function within the circuit system. FIG. 2 shows a differential-pair amplifier circuit 100 according to the present invention. Transistor 102 and transistor 104 form the differential-pair amplifier. Current source 106 is the tail current which provides bias current to the differential-pair. A system and method in accordance with the present invention adds a switching mechanism, in this case a transistor 108 coupled to the transistor 102 and transistor 104 for enabling and disabling the differential-pair amplifier 100. When the base voltage of the source 106 (switch node) is low, transistor 108 is disabled, and the amplifier 100 is enabled. When the switch node is connected to a high voltage, transistor 108 is turned on and the current from the source 106 is steered away from transistor 104 and transistor 108. As a result, transistor 102 and transistor 104 have no bias current and the differential-pair amplifier 100 is disabled.

So therefore the current source 106 is never turned off. The current source 106 is always on.

A system and method in accordance with the present invention solves the speed problem by turning on and off the differential-pair amplifier directly, while keeping the tail current source 106 on all the time. Also, the switching function can be implemented easily by adding only one transistor. This fast switching technique can be used in the signal paths where the switching time is critical. One example is the offset cancellation paths within a silicon germanium (SiGe) BiCMOS radio frequency (RF) integrated circuit (IC). It can also be utilized effectively in circuits implemented in CMOS and GaAs technologies for fast switching paths.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An analog differential-pair amplifier circuit comprising:
a transistor pair;
a constant current source directly connected to the transistor pair for directly providing a constant current to the transistor pair, wherein the constant current source is always active; and
a switching mechanism directly coupled to the transistor pair for steering the constant current away from the transistor pair when disabling the amplifier operation, wherein the analog amplifier circuit operation is quickly turned on and off due to the direct connection and control of the transistor pair by the switching mechanism.

2. The differential-pair amplifier of claim 1 wherein the switching mechanism comprises a third transistor.

3. An integrated circuit system comprising:
a control function; and
an analog differential amplifier circuit coupled to the control function; the analog differential amplifier circuit comprising a transistor pair; a constant current source directly connected to the transistor pair for directly providing a constant current to the transistor pair, wherein the current source is always active; and a switching mechanism directly coupled to the transistor pair for steering the constant current away from the transistor pair when disabling the amplifier operation, wherein the amplifier operation is quickly turned on and off due to the direct connection and control of the transistor by the switching mechanism.

4. The integrated circuit of claim 3 wherein the switching mechanism comprises a third transistor.

5. The integrated circuit of claim 3 wherein the integrated circuit comprises a silicon germanium (SiGe) BiCMOS radio frequency (RF) integrated circuit.

6. A method for controlling an analog differential-pair amplifier circuit wherein the analog differential-pair amplifier circuit comprises a transistor pair and a current source directly connected to the transistor pair, the method comprising:

directly providing a constant current to the analog differential-pair amplifier circuit by the current source, wherein the constant current source is always active; and steering the constant current away with a switching mechanism from the first and second transistor pair when the amplifier is disabled, wherein the amplifier is quickly turned on and off due to a direct connection and control of the transistor pair by the switching mechanism.

7. The method of claim 6 wherein the switching mechanism comprises a third transistor.

8. The analog differential-pair amplifier circuit of claim 1 wherein the bases of the transistor pair are coupled to input signals such that the transistor pair can function as an amplifier.

* * * * *